(12) United States Patent
Wang et al.

(10) Patent No.: US 7,562,321 B2
(45) Date of Patent: Jul. 14, 2009

(54) METHOD AND APPARATUS FOR STRUCTURED ASIC TEST POINT INSERTION

(75) Inventors: Seongmoon Wang, Plainsboro, NJ (US); Srimat T. Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 156 days.

(21) Appl. No.: 11/567,955

(22) Filed: Dec. 7, 2006

(65) Prior Publication Data

US 2007/0136700 A1 Jun. 14, 2007

Related U.S. Application Data

(60) Provisional application No. 60/743,025, filed on Dec. 12, 2005.

(51) Int. Cl.
*G06F 17/50* (2006.01)

(52) U.S. Cl. .................. 716/4; 716/1; 716/5; 716/6; 716/18

(58) Field of Classification Search .................. 716/4–6, 716/1, 18
See application file for complete search history.

(56) References Cited

U.S. PATENT DOCUMENTS

| 6,059,451 | A | 5/2000 | Scott et al. |
| 6,311,317 | B1 | 10/2001 | Khoche et al. |
| 6,408,412 | B1 | 6/2002 | Rajsuman |
| 6,456,099 | B1 | 9/2002 | Eldridge et al. |
| 6,480,800 | B1 | 11/2002 | Molyneaux et al. |
| 6,597,187 | B2 | 7/2003 | Eldridge et al. |
| 6,603,324 | B2 | 8/2003 | Eldridge et al. |
| 6,615,402 | B2 * | 9/2003 | Kaneko et al. ............ 716/16 |
| 6,621,260 | B2 | 9/2003 | Eldridge et al. |
| 6,636,995 | B1 | 10/2003 | Dean et al. |
| 7,223,616 | B2 * | 5/2007 | Duan et al. ............ 438/18 |
| 2001/0015773 | A1 | 8/2001 | Eldridge et al. |
| 2001/0020743 | A1 | 9/2001 | Eldridge et al. |
| 2001/0020747 | A1 | 9/2001 | Eldridge et al. |
| 2001/0052786 | A1 | 12/2001 | Eldridge et al. |
| 2003/0200492 | A1 * | 10/2003 | Nakao et al. ............ 714/724 |

OTHER PUBLICATIONS

Sethuram et al., Zero Cost Test Point Insertion Technique to Reduce Test Set Size and Test Generation Time for Structured ASIC, IEEE, Nov. 2006, printed pp. 1-8.*
Wikipedia Dictionary, Application-specific Integrated circuit, printed date Dec. 29, 2008, pp. 1-9.*
Nakao et al., Low Overhead Test Point Insertion for Scan-Based BIST, 1999, IEEE, pp. 348-357.*
Lin, C-c. et al., "Test Point Insertion: Scan Paths Through Combination Logic", 33rd Design Automation Conference, 1996 ACM, Inc., Las Vegas, NV, Jun. 1996.

* cited by examiner

*Primary Examiner*—Thuan Do
*Assistant Examiner*—Nghia M Doan
(74) *Attorney, Agent, or Firm*—James Bitetto (57) ABSTRACT

Determining a test point location in a structured application specific integrated circuit (ASIC) includes using one or more unused cells of the structured ASIC. In particular, an unused cell of the structured ASIC is identified and then a test point is inserted at the unused cell of the structured ASIC (e.g., if the unused cell is neighboring at least one used cell of the structured ASIC).

25 Claims, 8 Drawing Sheets

FIG. 1A

- EMBEDDED SRAM
- 104 — COMPLETX MULTI-GATE
- APLL
- DLL

| LAYER V (M5) | INDIVIDUAL MASK |
| LAYER IV (M4) | |
| LAYER III (M3) | SHARED MASK |
| LAYER II (M2) | |
| LAYER I (M1) | |

METHOD AND APPARATUS FOR STRUCTURED ASIC TEST POINT INSERTION

This application claims the benefit of U.S. Provisional Application No. 60/743,025 filed on Dec. 12, 2005, which is incorporated herein by reference.

BACKGROUND OF THE INVENTION

The present invention is related to application specific integrated circuits (ASICs), and in particular to improving the testability of structured ASICs using test point insertion techniques.

Integrated circuits (ICs) are typically made on a thin, circular silicon wafer, with each wafer holding hundreds of die. The transistors and wiring are made from many layers built on top of one another. Each successive layer has a pattern that is defined using a mask. The first several layers typically define the transistors and the last several layers typically define the metal wires between the transistors (i.e., the interconnect).

One type of ASIC is a cell-based ASIC. A cell-based ASIC uses "cells" or areas of the wafer to embed custom components. A cell-based ASIC typically uses predesigned logic cells (e.g., AND gates, OR gates, multiplexers, and flip-flops, for example). The cell-based ASIC is often built from rows of standard logic cells. As the functional requirements of a cell-based ASIC expand, the complexity of its design also typically increases. This, in turn, likely increases its design size. As a result, cell-based ASICs may use many metal layers and may need a large number of masks. The large number of masks needed for the ASIC typically results in increased costs associated with manufacturing these ASIC. Another major concern is the time needed to bring a chip to market (i.e., its time-to-market). Design turn-around time (TAT) is often a critical factor that governs time-to-market.

The use of field programmable gate array (FPGA) technology has attempted to solve several of these problems. A FPGA is an array of programmable logic cells that can implement combinational as well as sequential logic. FPGA mask costs are much less than cell-based ASIC mask costs. Further, the design TAT of FPGAs is typically less than the design TAT of cell-based ASICs. FPGA's, however, do not solve all of the shortcomings associated with cell-based ASICs. Specifically, in particular applications, power consumption and per chip cost of FPGAs are typically very high.

Structured ASICs (SAs) have emerged as a technology that solves many of the shortcomings of both FPGAs and cell-based ASICs. SAs consume less power than FPGAs and incur less NRE (non-recurring engineering) cost with shorter TAT compared to cell-based ASICs. SAs typically use a pre-defined array of macro cells organized in a 2-dimensial grid fashion. These pre-defined macro cells are normally realized using a limited number of metal or via layers (typically 2-3), which are not field-programmable. Verified clock trees, design-for-test (DFT) hardware and other generic cores such as serializer/deserializer (SerDes), memory, analog phase locked loops (APLL) and delay locked loops (DLL), are typically predefined and often do not need to be designed by users. Hence, the use of SAs often eliminates the design time involved in clock tree synthesis, testability related issues and the necessity of obtaining cores. Another advantage of using these pre-defined cells is that the physical design of these cells is fully verified for timing and signal integrity. This typically results in the total design cycle time of a SA being significantly shorter than that of a cell based ASIC.

Recent SA chips can accommodate designs comprising several million gates. The testing of a SA chip may or may not be performed during normal use of the chip.

Often, test points are used to test a circuit design. Test point insertion (TPI) typically involves inserting extra logic into a circuit such that internal signal lines in the circuit become better controllable and/or observable. The extra logic typically results in better testability of internal parts of the circuit, but often does not influence the functionality of the circuit in normal operation mode.

A goal of TPI is to select a number of signal lines in a combinational network as candidates for inserting observable points, so as to minimize the number of test vectors needed to detect all single stuck-at faults in the network. Stuck-at faults occur when a defect results in signal lines in the circuit being fixed at a value, i.e., fixed at logic 0 or fixed at logic 1. A test pattern for detecting a stuck-at fault at a signal line l has to activate the fault, i.e., the applied stimulus should result in a different value on l in the fault-free case compared to the faulty case, and it should propagate the fault-effect to an output.

TPI has become a popular design-for-test (DFT) technique to improve fault coverage for design using random pattern built-in self-test (BIST). Design-for-Test (DFT) hardware includes extra circuitry placed on the to-be-tested chip, but DFT hardware typically enables tests to be performed faster and/or with a higher fault coverage than testing the chip during its normal use. Fault coverage is usually given as:

$$\frac{\text{actual number of faults detected by a test}}{\text{total number of faults in a circuit design}}$$

and may be referred to as the quality of a test. Further, a built-in-self-test (BIST) includes extra circuitry placed on the to-be-tested chip, to the extent that the complete test function can be performed on chip, without external tester support.

Achieving high fault coverage for large designs, such as SA designs, typically requires a large amount of CPU time. Since the TAT is a critical factor for SAs, long test generation time is undesirable. Further, the cost associated with a test increases as the length of the test generation time increases.

Therefore, there remains a need to test a structured ASIC (SA) in a more efficient and cost effective manner.

BRIEF SUMMARY OF THE INVENTION

To test a structured ASIC more efficiently and at a lower cost, a TPI technique that does not involve inserting extra logic into the structured ASIC may be employed. In accordance with an aspect of the present invention, inserting a test point (TP) in a structured ASIC includes using one or more unused cell of the structured ASIC. In particular, an unused cell of the structured ASIC is identified. A test point is inserted using the unused cell of the structured ASIC (e.g., if the unused cell is neighboring at least one used cell of the structured ASIC).

In one embodiment, a list of candidate signal lines is generated. Each candidate signal line is associated with at least one used cell. Further, signal lines that belong to a timing critical area and/or a layout congested area can be identified, and the list can then include candidate signal lines that have not been identified.

In one embodiment, a circuit cone associated with the structured ASIC is identified, and it may be determined whether a level order of an output signal of the circuit cone is less than a predetermined value or greater than another predetermined value. In one embodiment, the list of candidate signal lines does not include these signal lines.

Further, an estimation of a number of independent faults for each signal line in the list of candidate signal lines may be determined, and an estimation of a total number of primary or pseudo inputs that need to be specified to observe a signal line in the list of candidate signal lines may be determined. In one embodiment, it is determined whether the number of independent faults for each signal line is below a predetermined fault threshold.

In one embodiment, a gain value for each candidate signal line in the list of candidate signal lines is computed. An estimation of the number of independent faults in a fanin cone of each signal line in the list of candidate signal lines may be determined. Further, an estimation of a total number of primary or pseudo inputs that need to be specified to observe a signal line in the list of candidate signal lines may be determined. In one embodiment, it is determined whether the estimation of the number of independent faults for each signal line is below a predetermined fault threshold or the estimation of a total number of primary or pseudo inputs is below another predetermined number.

A test point may be inserted into a signal line that has the largest gain value among the list of candidate signal lines. Further, the number of independent faults for each signal line in the circuit cones that overlap with the circuit cone may be updated, and the gain value may then be updated accordingly. Additionally, test points may be inserted repeatedly until a predetermined number of test points have been successfully inserted.

These and other advantages of the invention will be apparent to those of ordinary skill in the art by reference to the following detailed description and the accompanying drawings.

DETAILED DESCRIPTION

Figure 1A:
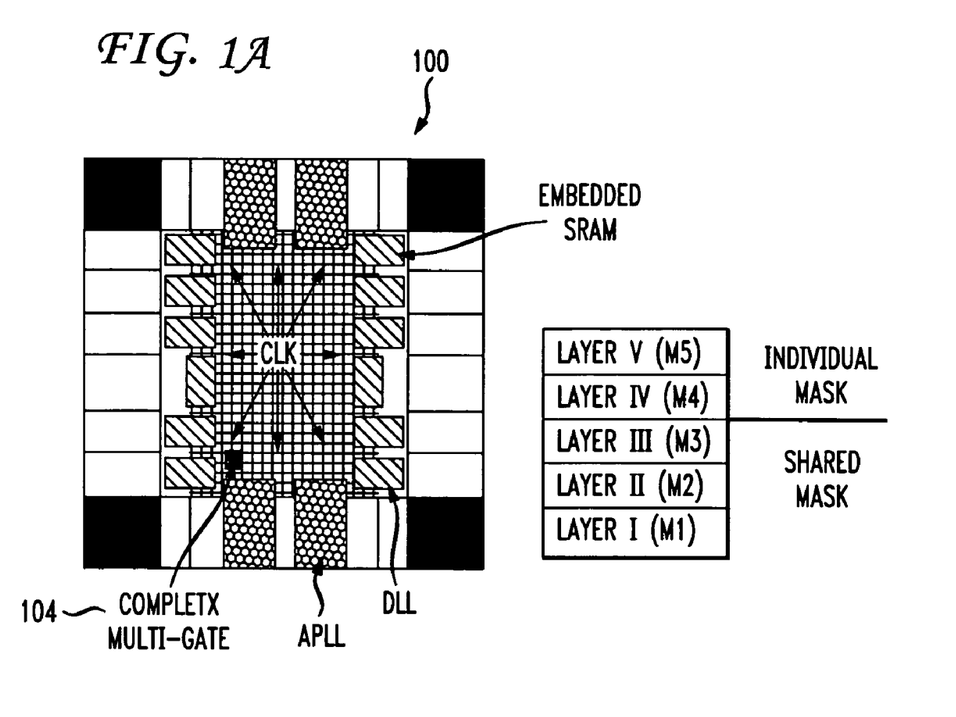
FIG. 1(a) is a block diagram of a structured application specific integrated circuit (ASIC)
Figure 1B:
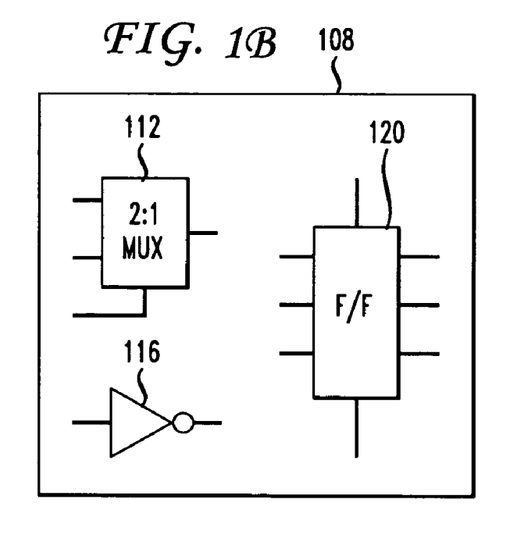
FIG. 1(b) is a block diagram of a complex multi-gate of the structured ASIC of FIG. 1(a)
Figure 1C:
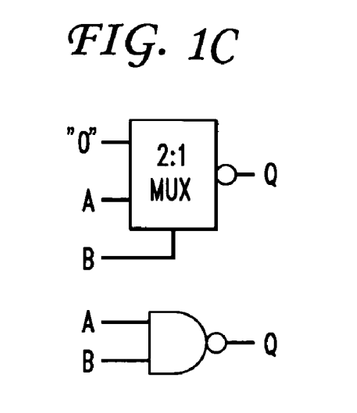
FIG. 1(c) is a block diagram of a NAND gate implementation in the structured ASIC of FIG. 1(a)

FIG. 1(a) shows an example of a structured ASIC (SA) 100. The SA 100 includes a plurality of predefined macro cells (e.g., predefined macro cell 104). Each pre-defined macro cell is referred to herein as a complex multi-gate (CMG). FIG. 1(b) shows a block diagram of a CMG 108. The CMG 108 includes a multiplexor 112, inverters (e.g., inverter 116), and a flip-flop 120. User functions are realized using the components in a CMG cell by programming the interconnects between them, as in FPGAs. For example, FIG. 1(c) shows how to realize a NAND gate using the multiplexor 112 in the CMG cell 108 of the SA 100. The number of programmable inter-connect layers may be limited to one or two. Therefore, a few custom masks are required and the NRE cost may be reduced.

Like FPGAs, typically more than 40% of CMG cells are not used to realize any user function. Areas of these unused CMG cells are typically used for routing. Although these CMG cells are not used to realize user functions, they can be used to implement test points. The test point technique described herein identifies useful, unused CMG cells that can be used for observation points without affecting existing placement and routing. In one embodiment, to eliminate any increase in routing area die and to minimize impact on the overall TAT, test points are inserted after placement and routing is completed. In one embodiment the purpose of inserting test points is to reduce test generation time and test data volume for SA designs.

In accordance with an embodiment of the present invention, the Test Point Insertion (TPI) technique uses flip-flops in the unused CMG cells. Further, flip-flops in unused CMG cells that do not cause any routing overhead may be identified and used for observation points. Hence, selection of test points can be based on layout information. Further, a new gain function is used to select signal lines into which test points are inserted.

The following is a brief background of test points (TPs) and test point insertion (TPI). Traditionally, TPs can be categorized into observation points and control points. An observation point (OP) is an additional primary output which is inserted into the circuit in order to obtain a better observability for one or more signal lines in the circuit. The observability for a signal line l is the "difficulty" to propagate a value change at line l to a primary output (PO).

Figure 2:
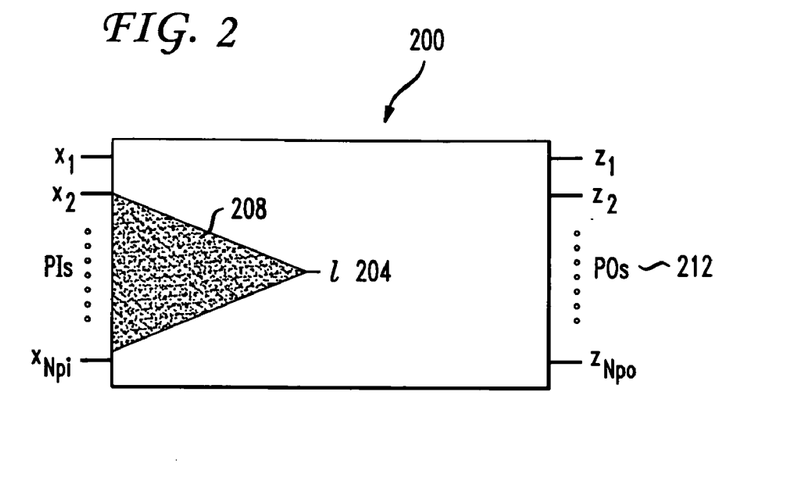
FIG. 2 is a block diagram of a region of influence of an observation point at a signal line.

FIG. 2 shows a diagram 200 of an OP inserted at an internal line l 204 of a given circuit. The observability of line l 204 itself and the observabilities of lines in the fanin cone 208 of line l 204 are improved (i.e., it becomes easier to propagate a value change to a PO 212).

A control point (CP) is an additional primary input plus additional logic inserted in the circuit under test (CUT) in order to obtain a better controllability for parts of the circuit. The controllability of a signal line l in the circuit is the difficulty to set line l to value v. Controllability can often be split into 1-controllability and 0-observability. The 1 (0)-controllability of a line l is the difficulty to get a 1 (0) on l.

Unlike an OP, which only typically affects the observability of a fanin cone of the OP, a CP may influence both the controllability and the observability of regions in the CUT. The observability of a signal line often depends on the controllability of other lines. Hence a controllability change also typically results in observabilities changes.

Figure 3:
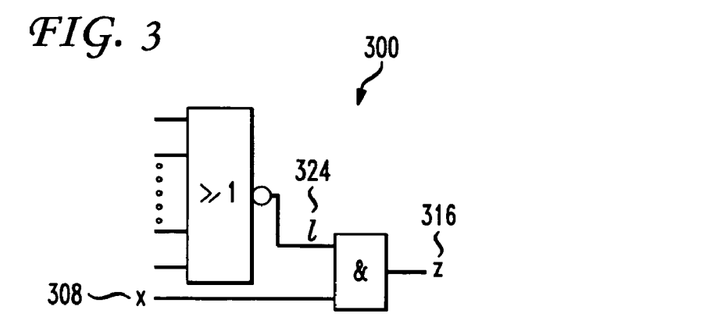
FIG. 3 is an exemplary circuit diagram having a signal line l.
Figure 4:
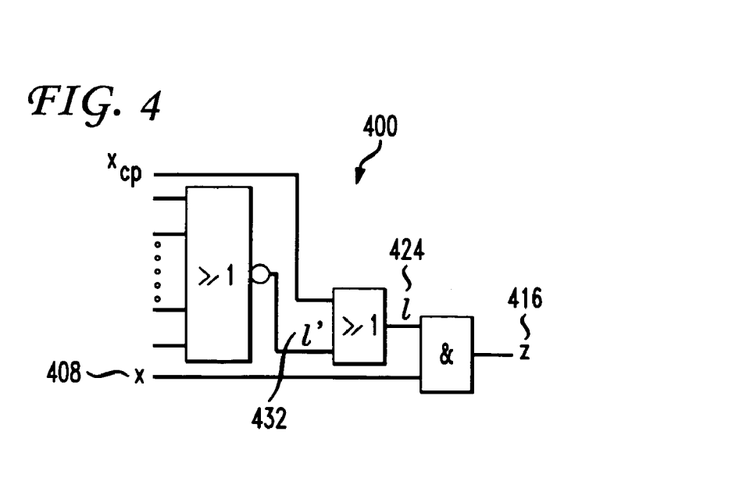
FIG. 4 is an exemplary circuit diagram with an OR gate inserted as a control point (CP) at signal line l.

FIGS. 3 and 4 show circuit diagrams 300, 400 to illustrate the impact of a control point on the observability. A 0/1 discrepancy at signal line x 308, 408 is only observable on respective output z 316, 416 when line l 324, 424 is 1. When l is 0, the value on z is 0 regardless of the value of x. By changing the controllability of l by the insertion of a CP at l, it typically becomes easier to get a 1 on l (put a 1 on input $x_{cp}$) and hence it also becomes easier to be able to observe a 0/1 discrepancy at signal line x on z; the observability of x changes due to the controllability change of l.

However, a CP also results in reduced observability in the fanin cone of the inserted CP. It may become more difficult to observe a 0/1 discrepancy at line l' 432 on an output. In addition to the requirements without the CP, a 0 is required on input $x_{cp}$ in order to propagate a 0/1 discrepancy to an output.

In accordance with an aspect of the present invention, the TPI approach may exploit the fact that test patterns that have many don't cares (defined as inputs that are not assigned Boolean values by an Automatic Test Pattern Generator (ATPG) and denoted by X's are more favorable to obtain compact test patterns. In many test compaction algorithms, X's in test patterns play an important role in compacting test pattern sets. Test compaction techniques may be classified into dynamic and static compaction according to when compaction of test patterns is performed. Dynamic compaction is performed during test generation. The ATPG picks a fault $f_p$ (called the primary fault) and generates a test pattern T for $f_p$. This pattern T typically has several don't cares. The ATPG tool then tries to detect several secondary faults by specifying Boolean values to the don't cares in T. Hence, if the ATPG generates test patterns that have additional don't cares, then additional secondary faults can be detected by each test pattern, resulting in a smaller test set. Static compaction merges multiple compatible test patterns into a single test pattern to reduce the number of patterns in the final test pattern set. Test patterns that have many don't cares can be easily merged with other test patterns.

Algorithm to Insert Test Points

Figure 5A:
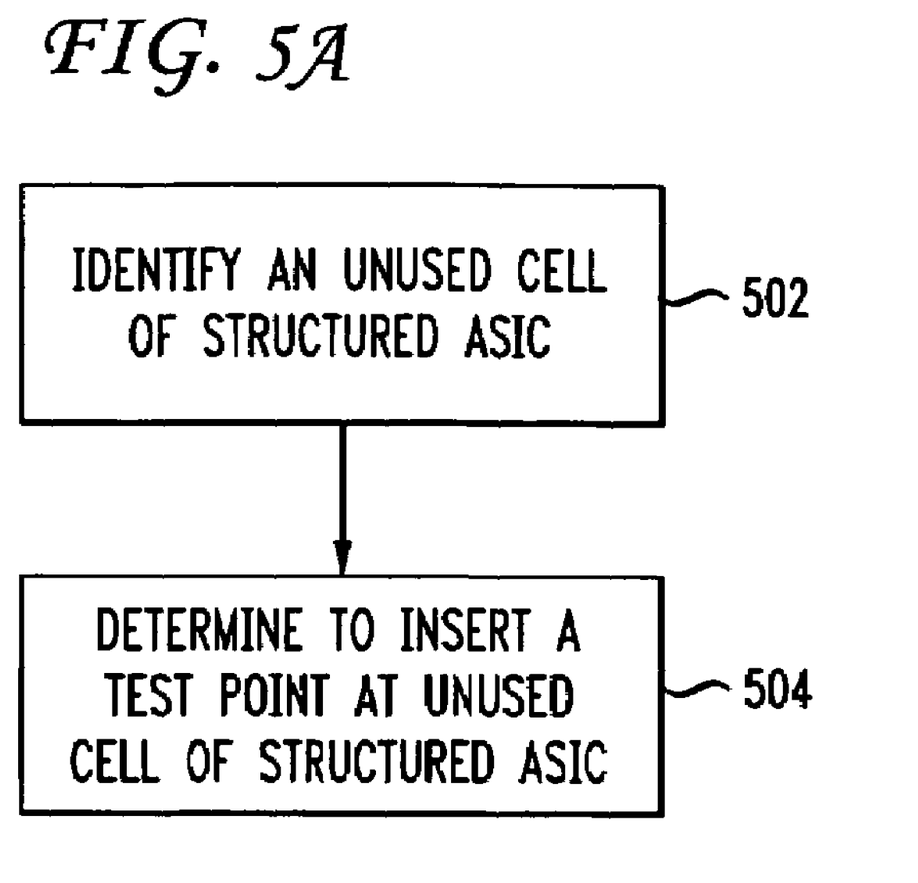
FIG. 5(a) is a flowchart showing the steps performed by a computer to identify an unused cell of a structured ASIC and determined to insert a test point into a structured ASIC in accordance with one embodiment of the present invention.

FIG. 5(a) is a flowchart showing the steps performed in accordance with one embodiment of the present invention. An unused cell of a structured ASIC is identified as shown in step 502. In step 504 it is determined whether to insert a test point at the unused cell of the structured ASIC.

Figure 5B:
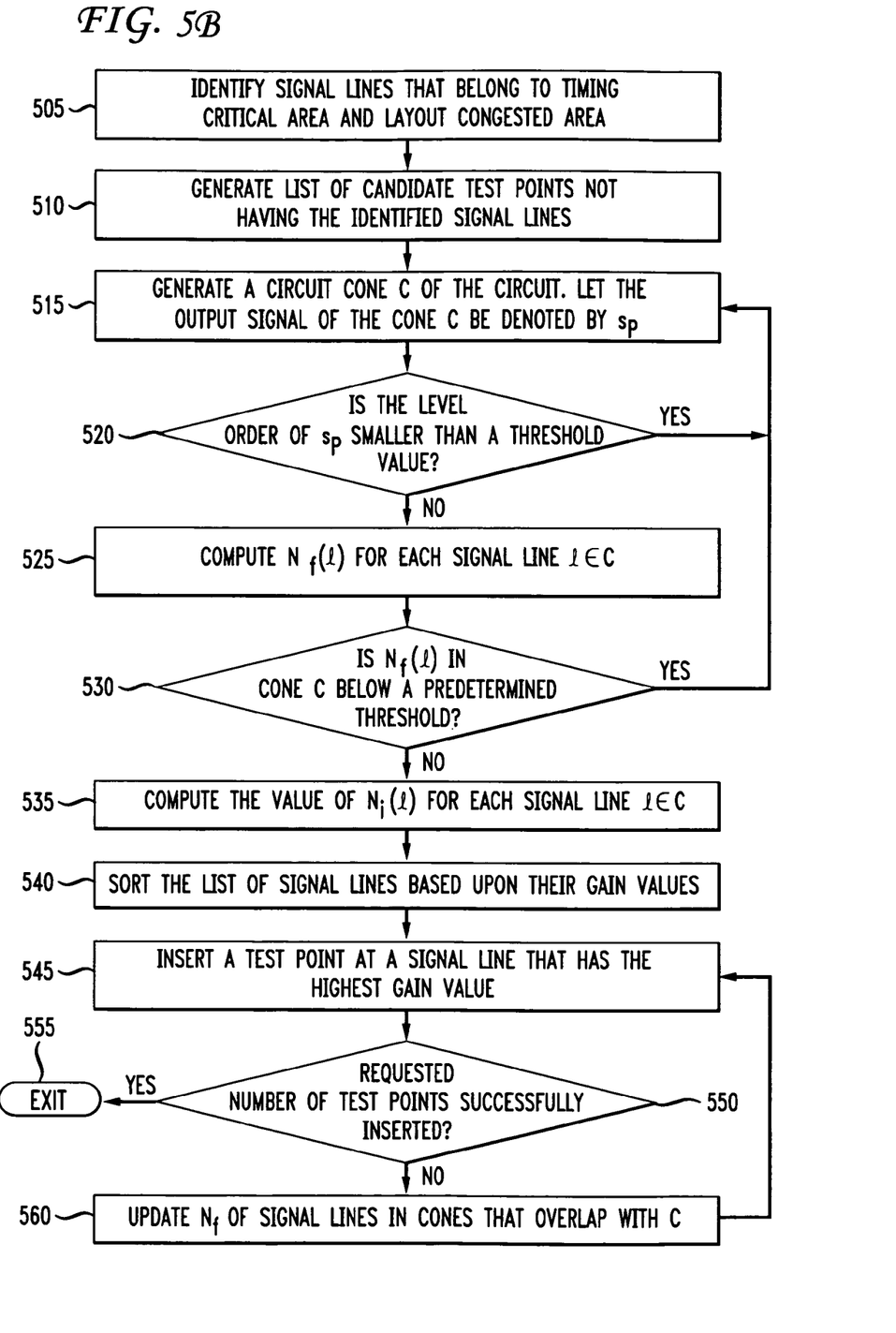
FIG. 5(b) is a flowchart showing the steps performed by a computer to insert test points into a structured ASIC in accordance with an embodiment of the present invention.

FIG. 5(b) is a flowchart showing the steps performed to insert test points into a SA in accordance with an embodiment of the present invention. Each of the steps shown in FIG. 5(b) are described in more detail below.

In step 505, signal lines that belong to a timing critical area and/or a layout congested area of the SA are identified. In one embodiment, a list of candidate test points is then generated without the identified signal lines included in the list in step 510. As described in more detail below, a circuit cone C of the circuit is then generated in step 515. A circuit cone (e.g., circuit cone C) is a set of signal lines that directly or indirectly (through sets of signals on paths to the output) drive an output, where propagated errors can be observed. In typical testing, only outputs are observed by testers. The output signal of the cone C is denoted by $s_p$.

Generating a test pattern for a fault in a circuit cone (e.g., circuit cone C) is independent of values assigned to the set of inputs that do not belong to circuit cone C. If a circuit cone is small (e.g., less than a predetermined size), the values assigned to the inputs of the circuit cone may be ignored.

It is then determined whether the level order of $s_p$ is smaller than a predetermined threshold value in step 520. Signals in a circuit are given a level order from inputs to outputs. All inputs are typically given level order 1 and if a signal is driven by only inputs through a gate, then the level of the signal is level 2. The mathematical definition is given by level order of signal (l)=maximum of level orders of inputs of l+1. Level orders are typically used during circuit simulation to find the order of signals that should be simulated.

If the level order of $s_p$ is smaller than the predetermined threshold value, the process returns to step 515 to generate another circuit cone C of the circuit. If the level order of $s_p$ is larger than the predetermined threshold value, then an estimation of the total number of independent faults $N_f(l)$ for each signal line l ∈ C is computed in step 525. It is then determined whether $N_f(l)$ in cone C is below a predetermined threshold in step 530.

Next, the value of $N_i(l)$ is computed for each signal line l ∈ C in step 535, where $N_i(l)$ is the estimation of the total number of primary or pseudo inputs that need to be specified to observe the signal line l. The list of signal lines are sorted based on a gain value computed for each signal line in step 540.

A test point is then inserted at a signal line that has a gain value above a predetermined value (e.g., the highest gain value) in step 545. It is then determined if the requested number of test points was successfully inserted in step 550. If so, then the process is completed and the process exits in step 555. If not, then the total number of independent faults $N_f(l)$ of signal lines in cones that overlap with C is updated in step 560 and the process returns to step 545.

Constraints: Hardware Overhead, Timing and Routing

In accordance with an embodiment of the present invention, the TPI technique inserts test points directly into the physical design of the SA. Hence, to minimize TAT, test point insertion should not require changing the existing placement and routing of the user design. This is achieved by using layout information (locations of cells) during the test point insertion process. Control points should be enabled during a test application and disabled during normal operation so that the test application does not affect the designed circuit function. In one embodiment, disabling and enabling control points are controlled by one or more test enable signals.

In the SA 100, a test enable signal is not accessible from the metal layer(s) that implement user functions. In one embodiment, control points are not inserted and only observation points are inserted. Inserting an observation point into a signal line l may increase the load capacitance of the driver that drives l. In order to prevent any possible performance impact, in one embodiment test points are not inserted into signal lines that are on a timing critical path. Further, since inserting a test point requires adding extra wires, it may not be possible to insert test points in an area that is highly routing congested without changing the existing placement and routing.

As described above, typically a large number of CMG cells of SA 100 are not used to realize user functions. Areas of unused CMG cells are typically used for routing purpose. In accordance with an embodiment of the present invention, the TPI technique uses flip-flops (FFs) in these unused CMG cells to implement observation points. Thus, no extra chip area is used to implement observation points. Although FFs on all of these unused CMG cells can be used for test points without any additional hardware, in one embodiment only a few unused FFS are used. A few unused FFs may be used for one or more of the following reasons: 1) since inserting a test point requires additional wires, inserting observation points increases chances of having physical defects on these wires and CMG cells used to implement observation points, thereby reducing the yield; and 2) in the SA 100, clock signals that drive FFs in unused CMG cells are clamped to GND/VDD to minimize power consumption. However, using a FF in an unused CMG for an observation point requires changing the unused FF to a used FF and enabling the system clock of that FF. This increases power consumption in the functional mode of the SA 100. In one embodiment, the number of observation points inserted are limited to less than 1% of the total number of flip-flops in the entire design, even if the design has more unused CMG cells.

Figure 6:
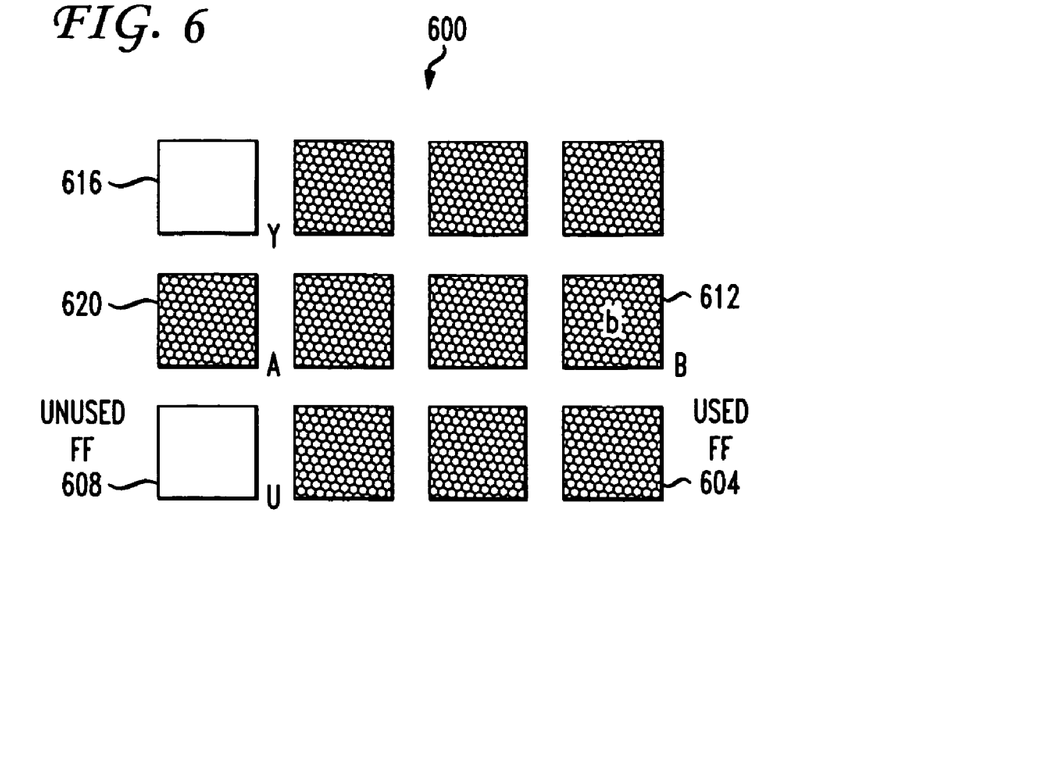
FIG. 6 is a block diagram of a part of a complex multi-gate array of a structured ASIC in accordance with an embodiment of the present invention.

FIG. 6 shows a part 600 of a CMG array. Highlighted squares, such as square 604, denote used CMG cells and white squares, such as square 608, represent unused CMG cells. Suppose that a signal line b in the cell B 612 is a good location to insert a test point to reduce test set size and test generation time. Signal line b can be observed using the FF in unused cell Y 616 or U 608. However, since the cells Y 616 and U 608 are located a large distance away from signal line b (cell B 612), connecting signal line b to the FF in either of the unused CMG cells 608, 616 requires a long wire. Hence, observing b by the FF in cell U 608 or Y 616 may not be possible without changing the routing in that area, unless the part 600 of the CMG array is sparsely routed. A long wire may increase signal propagation delay of the path to which b belongs. Thus, in one embodiment a test point is not inserted into signal line b.

Instead, signal lines in CMG cell A 620 can be connected to a FF either in U 608 or Y 616, which is adjacent to A 620, with a short wire. As used herein, a signal line l is considered as a potential test point candidate signal line if there is at least one unused FF in the neighborhood (e.g., surrounding FFs) of l.

An observation point at line l is inserted by adding a wire that connects the signal line l to an unused FF adjacent to signal line l in the part 600 of the CMG array. However, if line l lies on a timing critical path, then inserting a test point into l may entail performance degradation. If line l is in a highly routing congested area, it may be possible to add a short wire to connect l to an adjacent unused CMG cell. In one embodiment, the signal lines that belong to a routing congested area or lie on a critical path are identified and excluded from the potential test point candidates.

Gain Function

Figure 7:
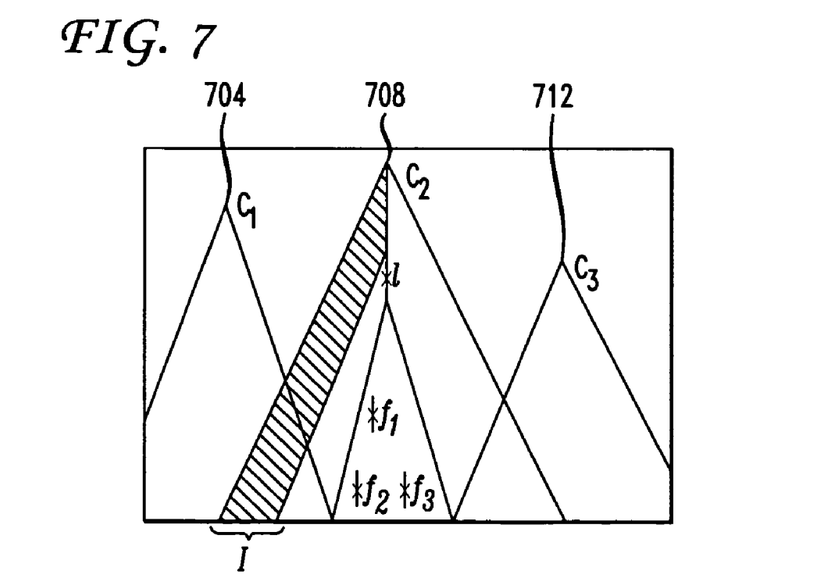
FIG. 7 is a diagram that includes three logic cones that each drive a primary output or a pseudo-primary output of a structured ASIC in accordance with an embodiment of the present invention.

FIG. 7 shows a circuit that includes three logic cones $C_1$ 704, $C_2$ 708, and $C_3$ 712. Each logic cone $C_1$ 704, $C_2$ 708, and $C_3$ 712 drives a primary output or a pseudo-primary output. Assume that the set of inputs I needs to be specified to propagate any fault effect on line l to the nearest observation point. In one embodiment, if an observation point is inserted at l, then none of the inputs in I needs to be specified. Now consider the faults $f_1$, $f_2$ and $f_3$ in the fanin cone of l. If they are all independent faults, then inserting an observation point into l will increase don't cares in the test patterns for $f_1$, $f_2$ and $f_3$ (two faults $f_a$ and $f_b$ are said to be independent if they cannot be simultaneously detected by any single pattern T). These additionally unspecified inputs can then be specified to detect more faults to reduce test set size. Note that since fault effects for $f_1$, $f_2$ and $f_3$ are observed at l without propagating them further, this can reduce ATPG run time.

Thus, the number of test points that are inserted into the SA 100 are limited. As a result, in one embodiment good signal lines are selected to insert test points that can reduce the test generation time and test data volume as much as possible. In one embodiment, a gain function (as described above with respect to step 540 in FIG. 5) is used to quantify how desirable it is to insert a test point at line l. The gain function G(l) (also referred to herein as gain value) for a signal line l can represent the total number of don't cares (i.e., X's) that are additionally generated when an observation point is inserted at l. The gain function for signal line l is mathematically defined as $$G(l) = N_f(l) \times N_i(l), \quad (1)$$

were $N_f(l)$ is an estimation of the total number of independent faults in the fanin cone of the signal line l and $N_i(l)$ is the estimation of the total number of primary or pseudo inputs that need to be specified to observe the signal line l. To detect the faults in the fanin cone of l, ATPG has to generate at least $N_f(l)$ vectors (because there are $N_f(l)$ independent faults). Due to inserting an observation point at l, an ATPG need not specify $N_i$ input bits to propagate fault effects at l to a primary output (PO) or a pseudo primary output (PPO) in $N_f(l)$ or more test patterns. Hence, in all the test patterns ($N_f(l)$ or more) there are at least $N_i(l)$ additional X's. Thus, the lower bound of the number of additional X's generated in the resulting test set is $N_f(l) \times N_i(l)$. If the gain function of a line l is large, then inserting an observation point into line l will increase many don't cares in the resulting test set.

Note that the term $N_i(l)$ of the gain function is similar to the observability measure of the Sandia Controllability/Observability Analysis Program (SCOAP). As a brief introduction to SCOAP (which is well-known by one of ordinary skill in the art), SCOAP is a test analysis measure that is used by commercial ATPG tools. The SCOAP controllability of a signal line is an estimate of the number of inputs that have to be assigned in order to get a 0(1) on the line. The SCOAP observability of a signal line is an estimate of the number of inputs that have to be set to propagate a fault-effect from that line to an output. Besides the number of inputs that have to be set, SCOAP also takes into account how 'deep' (level) the line is in the circuit and the number of fanout branches that are assigned due to the input assignments.

SCOAP measures can be inaccurate due to the presence of recovering signals. Hence, the gain function may facilitate the computation of a more accurate value of $N_i(l)$ for any signal line l. The SCOAP observability cost of an internal line l, which drives a gate G, is given by $$O(l_i) = \sum_{j \neq i} C_{\bar{c}}(l_j) + O(l_O), \quad (2)$$

where $l_j$ is the $j^{th}$ input of gate G, $l_o$ is the output line of gate G, and the controllability cost $C_{\bar{c}}(l_j)$ is the effort required to control the line $l_j$ to its non-controlling Boolean value $\bar{c}$. Note that the observability cost of the line $l_i$ is obtained by additions of controllabilities of its other inputs and the observability of $l_o$.

Figure 8A:
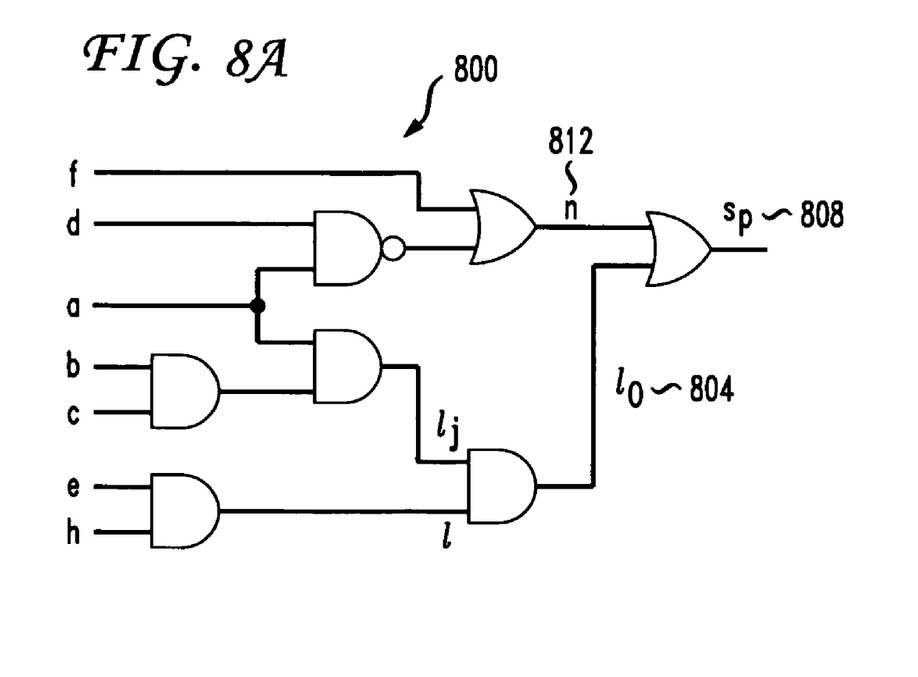
FIG. 8(a) is a circuit diagram illustrating the propagation of a fault effect on a signal line in accordance with an embodiment of the present invention.
Figure 8B:
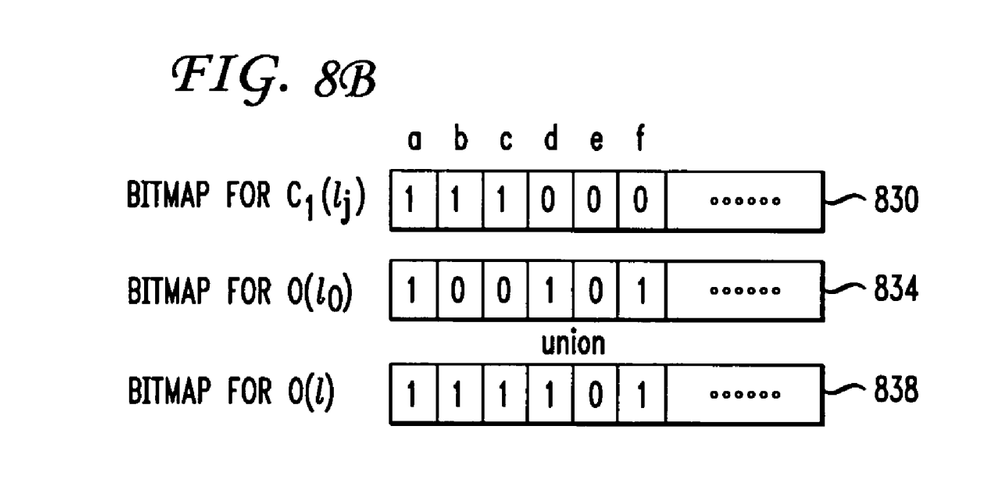
FIG. 8(b) is a diagram illustrating observability cost for a signal line of the circuit diagram of FIG. 8(a) in accordance with an embodiment of the present invention.

FIG. 8(a) is a circuit diagram 800. To propagate a fault effect on $l_o$ 804 to $s_p$ 808, line n 812 may be set to 0 by specifying inputs f=0, d=1, and a=1. Hence, $O(l_o)$=3. The observability of l is given by $O(l)=C_f(l_j)+O(l_o)$. Since $l_j$ can be set to 1 by specifying a, b, and c to 1, $C_f$, $(l_j)$=3, hence $O(l)(=C_f(l_j)+O(l_o))$ is 6. However, since input a overlaps in $C_f(l_j)$ and $O(l_o)$, the real observability cost is 5. This inaccuracy in observability cost due to overlapping inputs can be corrected by using union operations as shown in FIG. 8(b). In particular, FIG. 8(b) shows a bitmap 830 for $C_f(l_j)$, a bitmap 834 for $O(l_o)$, and a bitmap 838 for $O(l)$.

Since fault effect in $l_o$ can be observed by specifying a, d, and f to 1, 1, and 0, respectively, a, d, and f are assigned 1 in $O(l_o)$ and all other inputs are assigned 0's. Inputs a, b, and c should be specified to set $l_j$ to 1. Hence a, b, and c are assigned 1 in $C_f(l_j)$. Observability cost of line l is obtained by conducting a union operation of the set $C_f(l_j)$ with $O(l_o)$. Note that the set O(l) shown in FIG. 8(b) has exactly five bits that are specified. $N_i(l)$ is obtained by counting the number of bits in O(l) that are assigned 1's. Conducting union operations instead of additions can improve accuracy of observability measure $N_i(l)$. However, it often requires large memory space to be allocated to store union operation results. Hence, memory consumption for large circuits may exceed memory capacity of the computer. In one embodiment, to solve this problem, the circuit is partitioned into a large number of circuit cones, as shown in FIG. 7 (and first shown above in step 515 of FIG. 5). One circuit cone $C_i$ is considered at a time and the gain values, $N_i$ and $N_f$, are computed for the signals in this cone. Memory allocated for the current circuit cone $C_i$ may be freed before testability values for the next cone $C_{i+1}$ are computed. Thus, in one embodiment, the memory complexity of the algorithm is bounded by the number of signal lines in the largest cone of the circuit and the number of inputs that drive the cone.

To reduce run time to compute gain functions, "inexpensive" criteria may be used to avoid computing gain values for many signal lines that do not satisfy the criteria. This is referred to herein as "screening" and typically reduces run time significantly (e.g., because only a few signal lines in the circuit have very poor testability values). If the level order of the output signal of C is below a threshold value (as described above with respect to step 520 of FIG. 5) or the total number of independent faults in C is below a predetermined threshold (as described above with respect to step 530 of FIG. 5), then, in one embodiment, the gain functions of entire signal lines in cone C are not computed because cone C is small.

Figure 9:
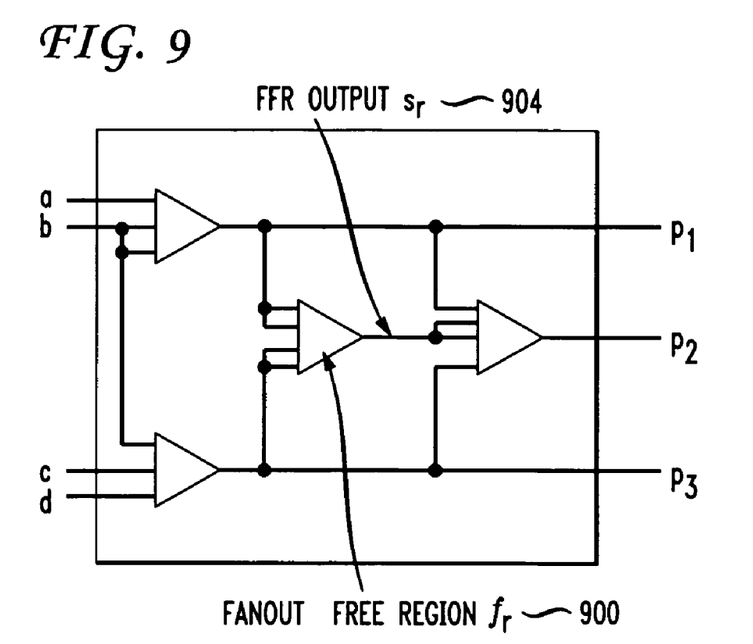
FIG. 9 is a diagram of fanout free regions associated with the circuit diagram of FIG. 8(a) in accordance with an embodiment of the present invention.

Further, in one embodiment, a "divide-and-conquer" approach may be used to compute the gain function to further reduce run time. In this approach, the circuit is decomposed into a network of fanout free regions (FFR) 900, as shown in FIG. 9. To compute the observability cost $N_i$ for all signal lines in a particular FFR $f_r$, the set of inputs $I_f$ that needs to be specified to observe a fault effect at the FFR output may be determined. FFR output $s_r$ 904 is defined as the output signal line of FFR $f_r$ 900. To compute the observability cost of a signal line l within the FFR $f_r$ 900, the set of inputs $I_l$, that needs to be specified to observe the fault effect on signal line l at FFR output $s_r$, may be computed. Then, a union operation of the set $I_l$ with the set $I_f$ may be conducted to compute the actual cost of $N_i(l)$. Note that the set $O(S_r)$ may be reused to compute observability costs for the signal lines in $f_r$ 900. This may reduce the run time significantly because complexity to compute the cost to observe a fault effect at line l is significantly lower compared to computing the cost to observe it at a primary output/pseudo primary output.

To compute $N_f$ for all of the signal lines in a cone C, the total number of independent faults, $N_i(f_r)$, in each of the individual FFR $f_r$ 900 in the circuit are first computed. Since no reconvergent fanout exists in a FFR, accurate values for $N_i(f_r)$ can be computed by additions, thereby reducing the run time. Further, as identifying independent faults in a circuit is typically expensive, the total independent faults can be approximated by the total number of collapsed faults. $N_f(l)$ for each signal line l within a FFR $f_r$ 900 is then computed.

Mergeability

As stated above, it is often important to generate large numbers of don't cares (X's) in test patterns. These X's may help in the test set reduction (e.g., if these X's facilitate the test generator merging many patterns to obtain compact test sets). To achieve this, a topology based mergeability analysis may be performed. Consider the case of generated X's being placed in one test pattern. In that case, the generated X's do not contribute to a reduction in the test length. Thus, the X's typically need to be spread across different locations in test patterns to obtain compact test sets.

Consider three signal lines $l_1$, $l_2$, and $l_3$. Exemplary $N_f$ and $N_i$ values for each of these signal lines are given in Table 1 below.

TABLE 1

| Signal Line | $N_f$ | $N_i$ | $G(1) = N_f \times N_i$ |
| --- | --- | --- | --- |
| $l_1$ | 625 | 1 | 625 |
| $l_2$ | 1 | 625 | 625 |
| $l_3$ | 25 | 25 | 625 |

It should be noted that all three signals have the same gain value G(1) (i.e., 625). In one embodiment, signal line $l_1$ is located very close to one of the primary outputs driven by a large fanin cone comprising 625 faults and may need one primary input (PI) or one pseudo primary input (PPI) for observation. Inserting an observation point at this location may generate one X at each test pattern that detects these 625 faults. Since these X's are all aligned in one column of the resulting test vectors, the X's generated cannot typically be (effectively) used for merging.

In one embodiment, signal $l_2$ is located very close to one of the primary inputs (only one fault in the fanin cone of $l_2$). In one embodiment, to observe this signal, we have to specify 625 inputs. Inserting an observation point into $l_2$ is likely not very beneficial, because the generated X's may belong to the same test pattern. Thus, even though it can be merged with another test pattern, the test pattern count may be reduced at most by one.

The third signal line $l_3$ may represent a desirable location for test point insertion. Inserting an observation point on $l_3$ may generate 25X's which can be divided among 25 test patterns (assuming that the 625 faults are independent). Thus, in the case of signal line $l_3$, there may be a higher chance that generated test patterns are merged with other patterns, thereby reducing the pattern count (e.g., significantly). In one embodiment, a priority flag called MERGEABILITY is maintained for each signal line l. While selecting signal lines for test point insertion, preference may be given for signal lines whose MERGEABILITY flags are high. In one embodiment, if either $N_f(l)$ or $N_i(l)$ of a signal line l is below a predetermined threshold value, then its MERGEABILITY flag is set low. Otherwise it stays high.

Figure 10:
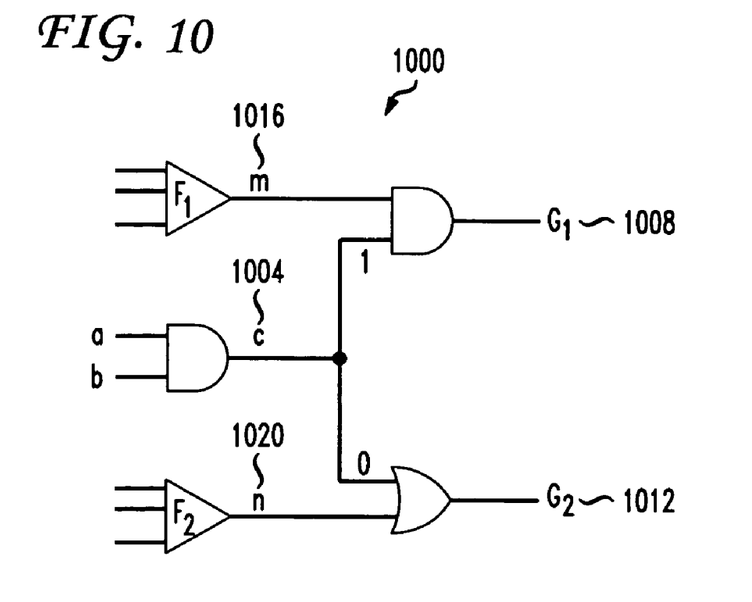
FIG. 10 is a block diagram of a circuit illustrating mergeability in accordance with an embodiment of the present invention.

FIG. 10 shows an embodiment of a circuit 1000 where a stem signal c 1004 branches to two conjugate gates $G_1$ 1008 and $G_2$ 1012 (e.g., AND/NAND gates are conjugate to OR/NOR gates). Suppose gates $G_1$ 1008 and $G_2$ 1012 have a large number of independent faults in its fanin cones $F_1$ and $F_2$, respectively. In one embodiment, test patterns generated for faults within the cone $F_1$ and $F_2$ cannot be merged because signal lines m 1016 and n 1020 cannot be simultaneously observed (boolean value 1 on c 1004 can make signal line m 1016 observable at the output of $G_1$ 1008, but the signal line n 1020 becomes unobservable). Inserting an observation point at m 1016 or n 1020 can, however, merge test patterns that detect faults in cones $F_1$ and $F_2$ together, thereby reducing the test length further. Thus, the MERGEABILITY flag for signal lines such as m 1016 or n 1020 may be set to high.

Updating $N_f$

Once a test point is inserted into a signal line in cone C, the gain values for the signal lines in C are updated to reflect the extra observation point that has been added into the circuit. In one embodiment, if a test point is inserted at a signal l, then another test point in the neighborhood of l is not inserted. Further, recomputing the gain values for the signals in the cone C after each time a test point is inserted is typically very expensive. Thus, an inexpensive approach that consumes very little CPU time is instead used to update the gain values after inserting a test point.

Figure 11A:
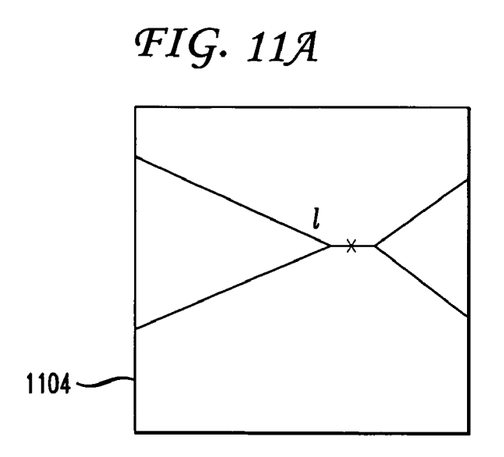
FIG. 11(a) is a diagram illustrating updating of a gain value for a fanin cone and a fanout cone in accordance with an embodiment of the present invention.
Figure 11B:
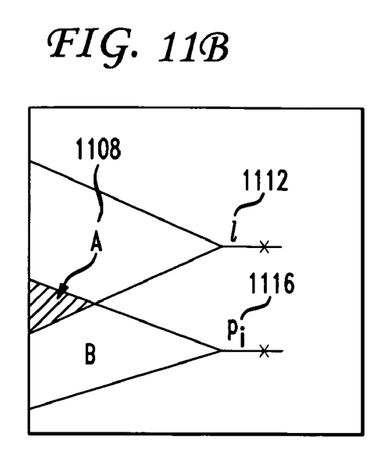
FIG. 11(b) is a diagram of an overlapping area of fanin cones in accordance with an embodiment of the present invention.

FIGS. 11(a) and 11(b) shows a diagram illustrating the updating of the gain value. FIG. 11(a) shows a diagram 1104 of the updating of the gain value for a fanin cone and a fanout cone. In one embodiment, when an observation point is inserted at line l, the signals in the fanin and fanout cone of l are marked as illegal so that it is not subsequently considered as a candidate test point. In particular, the test point inserted at l observes most of the faults in the fanin cone of l. Any test point inserted in the fanin cone or the fanout cone of l does not typically make a major difference in the result. If the fanin cone of a candidate test point p overlaps with the fanin cone of l where a test point is already inserted, then $N_f$ needs to be updated for signals in the fanin cone of p (since a test point is inserted at l, the faults in the overlapping area of the two fanin cone can be detected at the observation point at l). FIG. 11(b) shows an overlapping area A 1108 of the fanin cones of l 1112 and $p_i$ 1116. Thus, $N_f(p_i)$ of every candidate test point $p_i$(i-1,2 . . . ) whose fanin cone overlaps with the fanin cone of l is updated where a test point is inserted. The updated number of independent faults in the cone of $p_i$ 1116 (i.e. the new $N_f(p_i)$) is obtained by subtracting the number of independent faults in A 1108 from the original $N_f(p_i)$.

Computer Implementation

Figure 12:
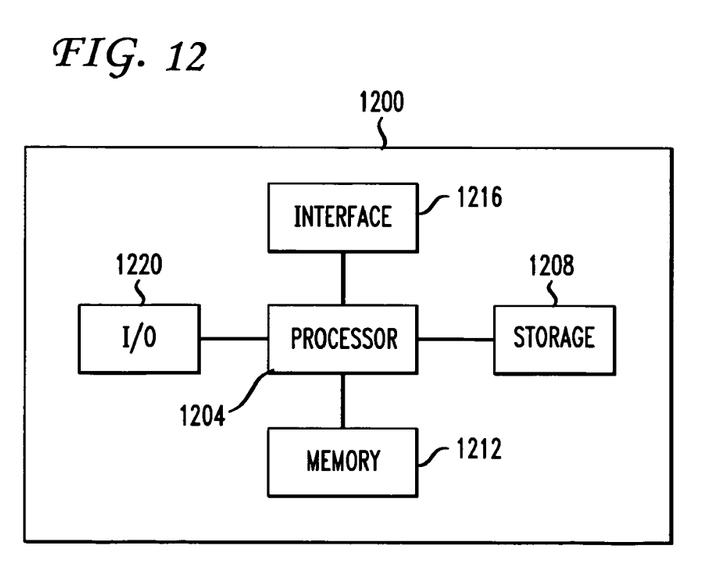
FIG. 12 shows a high level block diagram of a computer system which may be used in an embodiment of the invention.

The description above describes the present invention in terms of the processing steps required to implement an embodiment of the invention. These steps may be performed by an appropriately programmed computer, the configuration of which is well known in the art. An appropriate computer may be implemented, for example, using well known computer processors, memory units, storage devices, computer software, and other modules. A high level block diagram of such a computer is shown in FIG. 12. Computer 1200 contains a processor 1204 which controls the overall operation of computer 1200 by executing computer program instructions which define such operation. The computer program instructions may be stored in a storage device 1208 (e.g., magnetic disk) and loaded into memory 1212 when execution of the computer program instructions is desired. Computer 1200 also includes one or more interfaces 1216 for communicating with other devices (e.g., locally or via a network). Computer 1200 also includes input/output 1220 which represents devices which allow for user interaction with the computer 1200 (e.g., display, keyboard, mouse, speakers, buttons, etc.).

One skilled in the art will recognize that an implementation of an actual computer will contain other elements as well, and that FIG. 12 is a high level representation of some of the elements of such a computer for illustrative purposes. In addition, one skilled in the art will recognize that the processing steps described herein may also be implemented using dedicated hardware, the circuitry of which is configured specifically for implementing such processing steps. Alternatively, the processing steps may be implemented using various combinations of hardware and software. Also, the processing steps may take place in a computer or may be part of a larger machine.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method for inserting -a test point in a structured application specific integrated circuit (ASIC) comprising:
    completing a circuit design including user-function element placement and routing selection for said structured ASIC;
    identifying, after said completing step, unused logic cells of said structured ASIC for test point insertion, wherein said unused logic cells are unused for user-functions in said circuit design;
    selecting one of said identified unused logic cells that is adjacent to a signal line which is other than on at least one of: a path determined to be timing critical and an area of said structured ASIC determined to be layout congested;
    inserting a test point at said selected unused logic cell of said structured ASIC without inserting a logic element into the structured ASIC and without changing the placement of user-function elements of said circuit design in said structured ASIC; and
    physically implementing the circuit design with said inserted test point in said structured ASIC.

2. The method of claim 1 further comprising determining to insert a test point at said selected unused cell if said selected unused cell is neighboring at least one used cell of said structured ASIC.

3. The method of claim 1 further comprising generating a list of candidate signal lines of said structured ASIC, each candidate signal line in said list being a signal line associated with at least one used cell in a plurality of used cells in said structured ASIC.

4. The method of claim 3 further comprising identifying signal lines in said structured ASIC that belong to a predetermined area of said ASIC.

5. The method of claim 4 wherein said identifying signal lines further comprises identifying signal lines that belong to at least one of a timing critical area and a layout congested area of said ASIC.

6. The method of claim 5 wherein said list of candidate signal lines does not include said previously identified signal lines.

7. The method of claim 3 further comprising
identifying circuit cones in said structured ASIC; and
identifying at least one of signal lines in a circuit cone having a size less than a predetermined size, signal lines in a circuit cone whose level order is smaller than a first predetermined value, and signal lines in a circuit cone whose level order is greater than a second predetermined value.

8. The method of claim 7 wherein said list of candidate signal lines does not include said previously identified signal lines.

9. The method of claim 3 further comprising computing a gain value for each candidate signal line in said list of candidate signal lines of said structured ASIC.

10. The method of claim 9 further comprising:
determining an estimation of a number of independent faults in a fanin cone of each signal line in said list of candidate signal lines; and
determining an estimation of a total number of primary or pseudo inputs that need to be specified to observe a signal line in said list of candidate signal lines.

11. The method of claim 10 further comprising determining whether said estimation of a number of independent faults of each signal line is below a predetermined fault threshold or said estimation of a total number of primary or pseudo inputs is below a predetermined threshold.

12. The method of claim 10 further comprising the steps of:
inserting a test point into a signal line that has the largest gain value among said list of candidate signal lines;
updating said number of independent faults for each signal line in circuit cones that overlap with said circuit cone; and
updating said gain value.

13. The method of claim 12 further comprising repeatedly inserting test points until a predetermined number of test points have successfully been inserted.

14. A computer apparatus for determining a test point location in a hardware structured application specific integrated circuit (ASIC), the computer apparatus configured to perform steps comprising:
identifying, after completion of a circuit design including user-function element placement and routing selection for said structured ASIC, unused logic cells of said structured ASIC for test point insertion, wherein said unused logic cells are unused for user-functions in said circuit design;
selecting one of said identified unused logic cells that is adjacent to a signal line which is other than on at least one of: a path determined to be timing critical and an area of said structured ASIC determined to be layout congested;
determining to insert a test point without inserting a logic element at said selected unused logic cell of said structured ASIC and without changing the placement of user-function elements of said circuit design in said structured ASIC; and
applying a test enable signal to the structured ASIC to implement a test application.

15. The computer apparatus of claim 14 wherein said determining to insert a test point at said selected unused cell further comprises determining to insert a test point at said selected unused cell if said selected unused cell is neighboring at least one used cell of said structured ASIC.

16. The computer apparatus of claim 15, wherein the steps further comprise:
generating a list of candidate signal lines of said structured ASIC, each candidate signal line in said list being a signal line associated with at least one used cell in a plurality of used cells in said structured ASIC.

17. The computer apparatus of claim 16, wherein the steps further comprise:
identifying signal lines in said structured ASIC that belong to a predetermined area of said ASIC.

18. The computer apparatus of claim 17 wherein said identifying said signal lines further comprises identifying signal lines that belong to at least one of a timing critical area and a layout congested area of said ASIC.

19. The computer apparatus of claim 18 wherein said list of candidate signal lines does not include said previously identified signal lines.

20. The computer apparatus of claim 16, wherein the steps further comprise:
identifying circuit cones in said structured ASIC;
identifying at least one of signal lines in a circuit cone having a size less than a predetermined size, signal lines in a circuit cone whose level order is smaller than a first predetermined value, and signal lines in a circuit cone whose level order is greater than a second predetermined value.

21. The computer apparatus of claim 20 wherein said list of candidate signal lines does not include said previously identified signal lines.

22. The computer apparatus of claim 16, wherein the steps further comprise:
computing a gain value for each candidate signal line in said list of candidate signal lines of said structured ASIC.

23. The computer apparatus of claim 22, wherein the steps further comprise:
determining an estimation of a number of independent faults in a fanin cone of each signal line in said list of candidate signal lines; and
determining an estimation of a total number of primary or pseudo inputs that need to be specified to observe a signal line in said list of candidate signal lines.

24. The computer apparatus of claim 23, wherein the steps further comprise:
determining whether said estimation of a number of independent faults of each signal line is below a predetermined fault threshold or said estimation of a total number of primary or pseudo inputs is below a predetermined threshold.

25. The computer apparatus of claim 23, wherein the steps further comprise:
determining to insert a test point into a signal line that has the largest gain value among said list of candidate signal lines;
updating said number of independent faults for each signal line in circuit cones that overlap with said circuit cone; and
updating said gain value.

* * * * *